(12) United States Patent
Yu et al.

(10) Patent No.: US 8,248,712 B2
(45) Date of Patent: Aug. 21, 2012

(54) LIGHT RAY CONCENTRATION DEVICE

(75) Inventors: Tai-Cherng Yu, Taipei Hsien (TW); Yung-Lun Huang, Taipei (TW); I-Thun Lin, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 60 days.

(21) Appl. No.: 12/960,443

(22) Filed: Dec. 3, 2010

(65) Prior Publication Data

US 2012/0019935 A1    Jan. 26, 2012

(30) Foreign Application Priority Data

Jul. 23, 2010   (TW) ............................... 99124443 A

(51) Int. Cl.
*G02B 3/08* (2006.01)
*F24J 2/08* (2006.01)

(52) U.S. Cl. .......................... 359/743; 126/698; 126/699
(58) Field of Classification Search ................. 126/698, 126/699; 359/741, 742, 743
See application file for complete search history.

(56) References Cited

U.S. PATENT DOCUMENTS

| | | | |
|---|---|---|---|
| 6,653,551 B2* | 11/2003 | Chen | 136/246 |
| 2010/0313879 A1* | 12/2010 | Huang | 126/683 |
| 2011/0132430 A1* | 6/2011 | Chen et al. | 136/246 |
| 2012/0073626 A1* | 3/2012 | Chen et al. | 136/246 |

* cited by examiner

*Primary Examiner* — David N Spector
(74) *Attorney, Agent, or Firm* — Altis Law Group, Inc.

(57) ABSTRACT

A light ray concentration device includes a concentrating lens and a base for holding the concentrating lens. The concentrating lens includes a planar surface defining a number of first Fresnel zones and a convex surface facing away from the planar surface and defining a number of second Fresnel zones. The first and second Fresnel zones are coaxial with each other.

10 Claims, 4 Drawing Sheets

LIGHT RAY CONCENTRATION DEVICE

BACKGROUND

1. Technical Field

The present disclosure relates to light ray concentration devices and, particularly, to a light ray concentration devices for solar cells.

2. Description of Related Art

Light rays concentration devices for solar cells generally include a convex lens that focuses light ray on the solar cells. To reduce the distance between the convex lens and the solar cell, the convex lens with a short focal length is preferred. However, the thickness of the convex lens having a short focal length is large, which means that the light ray concentration device is bulky. To solve this problem, Fresnel lenses are employed in the light rays concentration devices instead of the convex lenses. However, a typical Fresnel lens only defines a Fresnel zone on a planar side thereof for concentrating light rays. The focal length of the typical Fresnel lens is not short enough to be satisfactory.

Therefore, it is desirable to provide a new light ray concentration device, which can overcome the above-mentioned limitations.

DETAILED DESCRIPTION

Figure 1:
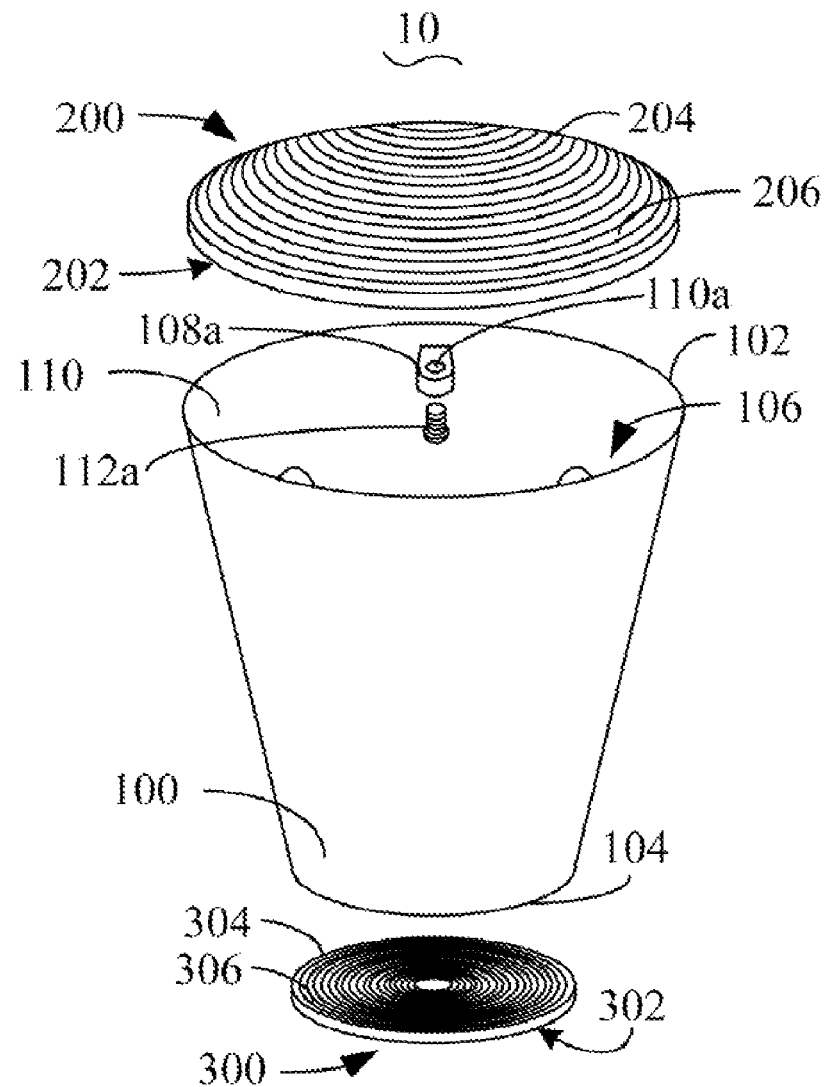
FIG. 1 is an isometric, exploded view of a light ray concentration device, according to an exemplary embodiment.

Referring to FIGS. 1 to 4, a light ray concentration device 10, according to an exemplary embodiment, is used for focusing light rays on a solar cell 20, thereby increasing a power generation efficiency of the solar cell 20. The light ray concentration device 10 includes a base 100 and a concentrating lens 200.

The phrase "Fresnel zones" used herebelow refers to a set of concentric annular sections formed on a Fresnel lens. Each of the concentric annular sections effectively chops a continuous surface of a standard lens into a set of surfaces of the same curvature, with discontinuities therebetween. The Fresnel zones are configured for concentrating light rays.

The base 100 is made of opaque material, such as plastic, and defines a frusto-conical shaped light hole 106 therethrough. The light hole 106 defines a first opening 102 and a second opening 104 at two opposite ends thereof. The first opening 102 faces upwards and is bigger than the second opening 104. The base 100 protrudes three first protrusions 108a from the inner surface of the light hole 106, near the first opening 102. The three protrusions 108a are equidistantly arranged along a circle (not shown) that is substantially parallel to the first opening 102. Each of the three protrusions 108a defines a first screw hole 110a along a direction parallel to the central axis (not shown) of the base 100. Three first screws 112a are respectively screwed into the three first screw holes 110a, with nuts thereof facing downwards.

The concentrating lens 200 is made of transparent material, such as glass and polythene, and is round-shaped in accordance with the first opening 102. The concentrating lens 200 includes a planar surface 202 and a convex surface 204 facing away from the planar surface 202. The planar surface 202 defines a set of first Fresnel zones 208. While the convex surface 204 defines a set of second Fresnel zones 206. The first and second Fresnel zones 208, 206 are coaxial with the concentrating lens 200.

Figure 3:
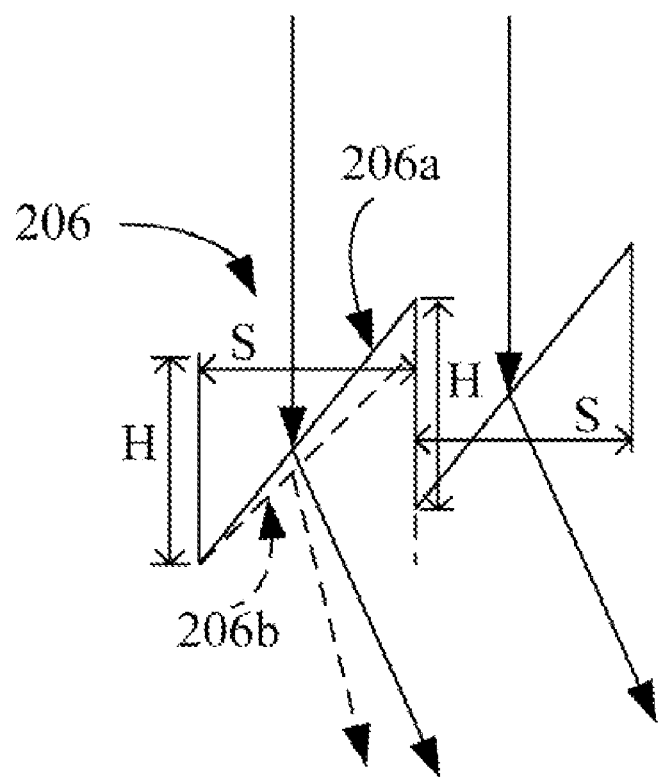
FIG. 3 is a schematic view showing how light rays are refracted by a second Fresnel zone formed on a convex plate of a concentrating lens of the light ray concentration device of FIG. 1; for comparison, the dotted lines show how light rays are refracted by a comparison Fresnel zone that is formed on a planar plate and has the same width and depth as the second Fresnel zone.

Referring to FIG. 3, provided that the width (S) and the depth (H) of the second Fresnel zone 206 are constant that of a more tilted surface 206a formed thereof can refract the light rays more efficient, as compared to a second Fresnel zone of a less tilted surface 206b. Therefore, compared to a conventional way that the second Fresnel zone 206 is defined on a planar plate (not shown), the second Fresnel zone 206 defined on the convex surface 204 can efficiently shorten the focal length of the concentrating lens 200.

Figure 4:
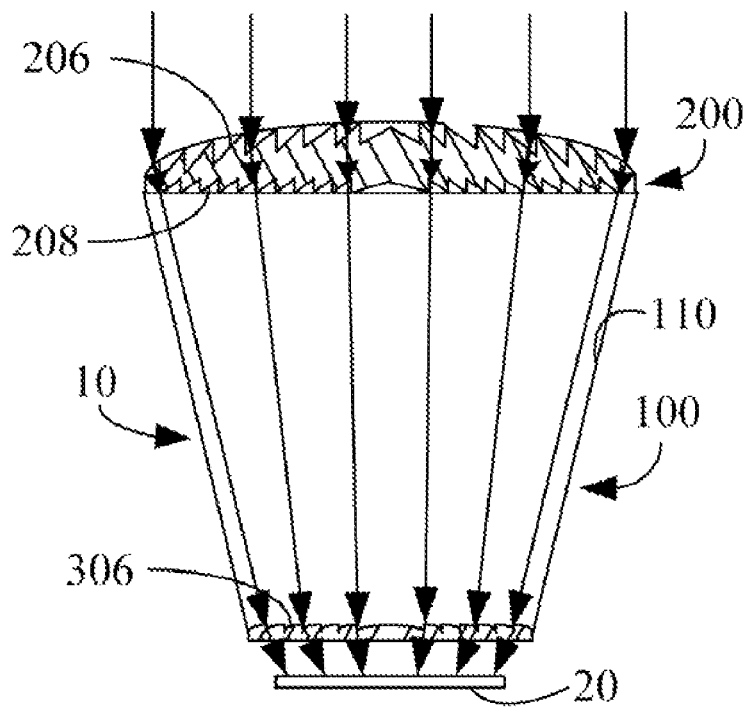
FIG. 4 is a cross-sectional view of an assembled light ray concentration device of FIG. 1 which is in operation.

Referring to FIG. 4, in assembly, the light ray concentration device 10 is arranged upon the solar cell 20, with the second opening 104 facing exactly to the solar cell 20. The concentrating lens 200 is received in the first opening 102 and is held by the three first screws 112a. The first screws 112a are adjusted so that light rays refracted by the concentrating lens 200 focus on the solar cell 20. In operation, the light rays enter the concentrating lens 200 and are firstly concentrated by the second Fresnel zone 206. Then, the light rays are concentrated again by the first Fresnel zone 208, which shortens a focal length of the concentrating lens 200. Thus, the height of the base 100 is small and the light ray concentration device 10 is compact.

Figure 2:
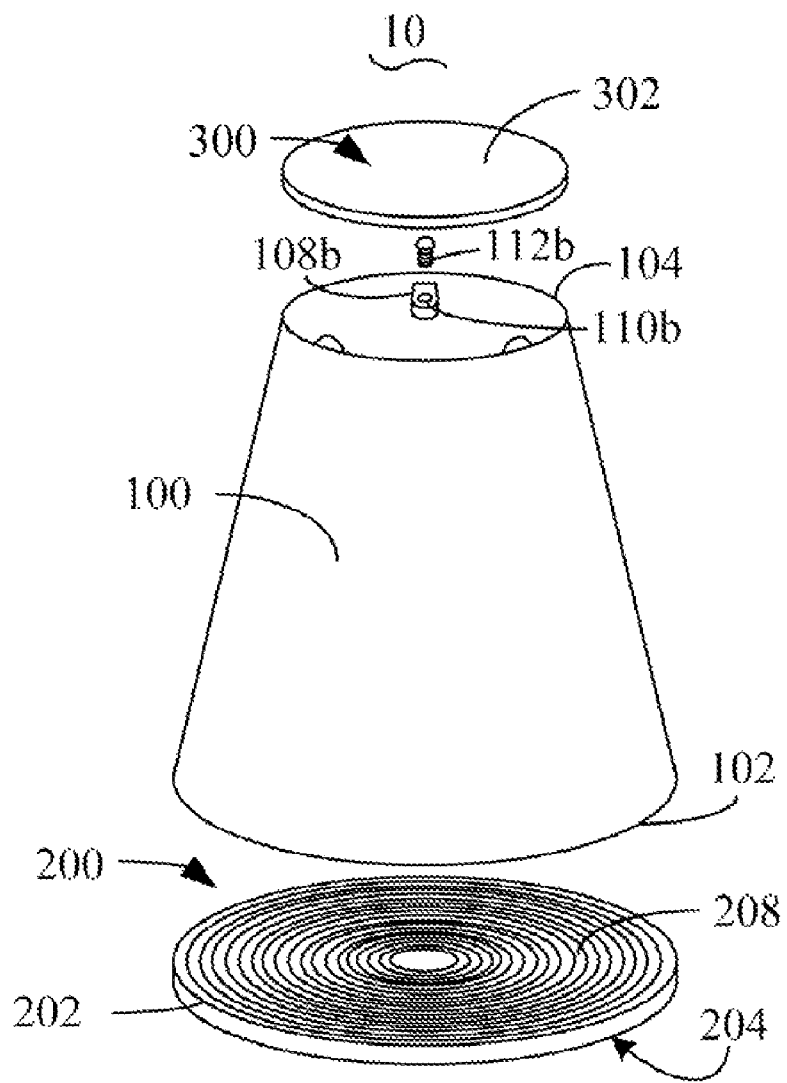
FIG. 2 is similar to FIG. 1, but viewed at another angle.

Referring to FIGS. 1 and 2, in alternative embodiments, the light ray concentration device 10 further includes a Fresnel lens 300 that is made of transparent material, such as glass and polythene. The Fresnel lens 300 is round-shaped according to the first opening 102 and includes a mirror surface 302 and a threaded surface 304. The threaded surface 304 includes a set of third Fresnel zones 306. The base 100 protrudes three second protrusions 108b from the inner surface of the light hole 106, near the second opening 104. The three second protrusions 108b are positioned evenly along a circle (not shown) that is substantially parallel to the second opening 104. Each protrusion 108a defines a second screw hole 110b along a direction parallel to the central axis (not shown) of the base 100. Three second screws 112b are respectively screwed into the three second screw holes 110b, with nuts thereof facing downwards.

In assembly, the Fresnel lens 300 is received in the second opening 104 and is held by the three second screws 112b. The second screws 112ab are adjusted so that light rays focuses on the solar cell 20. The light ray concentration device 10 is arranged upon the solar cell 20, with the Fresnel lens 300 near the solar cell 20 and the concentrating lens 200 away from the solar cell 20. As the concentrating lens 200 is away from the solar cell 20, focal offsets induced by the concentrating lens 200 will be amplified during the light rays running from the concentrating lens 200 to the Fresnel lens 300. However, the focal offset can be amended by adjusting the Fresnel lens 300. Therefore, the accuracy requirement of adjusting the concentrating lens 200 and the Fresnel lens 300 is reduced.

In alternative embodiments, a refraction film 110 is painted/coated/deposited on the inner surface of the base 100 for refracting light rays, thereby preventing light rays that runs into the light hole 106 being absorbed by the base 100. Thus, light rays concentrating efficiency of the light ray concentration device 10 is improved. The refraction film 110 can be made of silver or a mixture of about 92.5% silver and about 7.5% copper.

While various embodiments have been described, it is to be understood that the disclosure is not limited thereto. To the contrary, various modifications and similar arrangements (as would be apparent to those skilled in the art), are also intended to be covered. Therefore, the scope of the appended claims should be accorded the broadest interpretation so as to encompass all such modifications and similar arrangements.

What is claimed is:

1. A light ray concentration device, comprising:
    a concentrating lens, comprising:
        a planar surface defining a plurality of first Fresnel zones; and
        a convex surface facing away from the planar surface and defining a plurality of second Fresnel zones, the first and second Fresnel zones coaxial with each other; and
    a base holding the concentrating lens.

2. The light ray concentration device of claim 1, wherein the first and the second Fresnel zones are coaxial with a central axis of the concentrating lens.

3. The light ray concentration device of claim 1, wherein the concentrating lens is round-shaped.

4. The light ray concentration device of claim 1, wherein a refraction film is arranged on an inner surface of the base.

5. The light ray concentration device of claim 4, wherein the refraction film is made of silver.

6. The light ray concentration device of claim 4, wherein the refraction film is made of a mixture of about 92.5% silver and about 7.5% copper.

7. The light ray concentration device of claim 1, wherein the base defines a frusto-conical-shaped light hole therethrough, the light hole has a first opening and a second opening at two opposite ends thereof, the first opening is bigger than the second opening, the concentrating lens is positioned on the first opening.

8. The light ray concentration device of claim 7, wherein the base protrudes three first protrusions in an inner surface of the light hole, near the first opening, the three protrusions are equidistantly arranged along a circle that is substantially parallel to the first opening, each of the three protrusions defines a first screw hole along a direction parallel to a central axis of the base, three first screws are respectively screwed into the three first screw holes, the concentrating lens is held by the three first screws.

9. The light ray concentration device of claim 7, further comprising a Fresnel lens positioned on the second opening, wherein the Fresnel lens is round-shaped according to the first opening and comprises a mirror surface and a threaded surface at two opposite ends thereof, the threaded surface defines a plurality of third Fresnel zones facing the first Fresnel zones.

10. The light ray concentration device of claim 9, wherein the base protrudes three second protrusions in the inner surface of the light hole, near the second opening, the three second protrusions are positioned evenly along a circle that is substantially parallel to the second opening, each second protrusion defines a second screw hole along a direction parallel to the central axis of the base, three second screws are respectively screwed into the three second screw holes, the Fresnel lens is held by the three second screws.

* * * * *